United States Patent [19]

Sheppard Douglas P.

[11] Patent Number: 4,549,336
[45] Date of Patent: Oct. 29, 1985

[54] METHOD OF MAKING MOS READ ONLY MEMORY BY SPECIFIED DOUBLE IMPLANTATION

[75] Inventor: Sheppard Douglas P., Grapevine, Tex.

[73] Assignee: Mostek Corporation, Carrollton, Tex.

[21] Appl. No.: 608,539

[22] Filed: May 9, 1984

Related U.S. Application Data

[62] Division of Ser. No. 334,900, Dec. 28, 1981, abandoned.

[51] Int. Cl.⁴ .................. H01L 29/78; H01L 21/263
[52] U.S. Cl. .................... 29/576 B; 29/571; 148/1.5; 148/187; 357/91; 357/23.12
[58] Field of Search ............... 29/576 B, 571; 148/1.5, 148/187; 357/23 D, 91

[56] References Cited

U.S. PATENT DOCUMENTS

| | | | |
|---|---|---|---|
| 3,775,191 | 11/1973 | McQuhae | 357/91 X |
| 4,145,233 | 3/1979 | Sefick et al. | 357/23 D X |
| 4,193,079 | 3/1980 | Yeh | 357/23 D X |
| 4,205,330 | 5/1980 | Klein | 357/23 D |
| 4,261,761 | 4/1981 | Sato et al. | 148/1.5 |
| 4,305,201 | 12/1981 | Tielert | 29/571 |
| 4,315,781 | 2/1982 | Henderson | 357/23 D X |
| 4,333,225 | 6/1982 | Yeh | 29/571 |
| 4,354,307 | 10/1982 | Vinson et al. | 29/571 |
| 4,382,826 | 5/1983 | Pfleiderer et al. | 148/1.5 |
| 4,394,181 | 7/1983 | Nicholas | 148/1.5 |
| 4,395,725 | 7/1983 | Parekh | 357/23 D |
| 4,402,761 | 9/1983 | Feist | 148/1.5 |
| 4,406,049 | 9/1983 | Tam et al. | 29/571 |
| 4,455,742 | 6/1984 | Williams et al. | 29/576 B |

Primary Examiner—Upendra Roy

[57] ABSTRACT

The power consumption and corresponding speed of an integrated circuit is scaled by means of adjusting the channel width for MOS transistors. A transistor (12) is initially fabricated with a channel (24) having a width $W_1$. The channel (24) receives a depletion type implant (30) to make the transistor (12) lightly depleted. An enhancement implant (32) is applied to the channel (24) to cover a selected area (24a). The enhancement implant (32) is made substantially stronger than the depletion implant (30). This results in a first section (24a) of the channel (24) having a large threshold voltage while the second section (24b) of channel (24) has a relatively small pinch-off voltage. The size of the second section (24b) is selectively controlled to scale the source-drain current of transistor (12) and the corresponding power consumption of the transistor (12). The method of applying the first and second implants (30, 32) can be easily incorporated into conventional ROM fabrication without the need for additional manufacturing steps.

3 Claims, 4 Drawing Figures

METHOD OF MAKING MOS READ ONLY MEMORY BY SPECIFIED DOUBLE IMPLANTATION

This application is a division, of application Ser. No. 334,900, filed Dec. 28, 1981, now abandoned.

TECHNICAL FIELD

The present invention pertains to MOS (metal oxide semiconductor) circuits and in particular to the control of power consumption for such circuits.

BACKGROUND ART

Certain types of integrated circuits such as dynamic and static random access memories can be speed sorted. The fast devices can then be sold at a premium to those customers who require high speed parts. The slower devices can then be sold to customers who do not have such a high speed requirement. This is conventional in the industry.

The power consumption of an integrated circuit is typically related to its speed. That is, the greater the speed the greater the power consumption. Therefore there is often a tradeoff between the speed of a part and the power it consumes.

Read only memory (ROM) circuits are fabricated with a customer bit pattern that is unique for each customer. In a sale to a customer purchasing a ROM circuit there is generally designated a minimum operating speed for the part. When the ROM circuits are tested those circuits that do not meet this minimal requirement cannot be used for any purpose and therefore must be discarded. This can constitute a substantial overhead expense for the manufacturer of ROM circuits. A basic ROM circuit is typically designed for the widest application and then custom programmed for each individual customer application. In this case the basic circuit must have a speed capability sufficiently fast for that of the most demanding customer. Since the economies of manufacturing require one basic manufacturing process, all of the customers must receive the same basic part. Therefore many of the customers receive parts that operate at a much higher speed and consume much more power than they require. The custom design of parts would be far too expensive in this market.

In view of the problems encountered in the manufacturing of read only memories and similar type circuits, there exists a need for a circuit which can be custom produced to have any of a wide range of speed and power consumption parameters while at the same time utilizing one basic ROM circuit which is manufactured in a conventional process.

SUMMARY OF THE INVENTION

A selected embodiment of the present invention comprises a method for scaling the power consumption of an MOS transistor which is typically utilized in a read only memory integrated circuit. The MOS transistor is fabricated to have a source, drain and channel in a conventional manner. The channel of the transistor can optionally receive a predetermined type implant. In a further step there is a reduction in the effective size of the implanted channel to reduce the source-drain current and resulting power consumption of the MOS transistor.

In a further aspect of the present invention the channel receives an initial depletion implant. The effective size of the implanted channel is reduced by applying an enhancement implant to a predetermined section of the channel to substantially limit current flow through the predetermined section of the channel thereby reducing the width of the channel for the MOS transistor.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
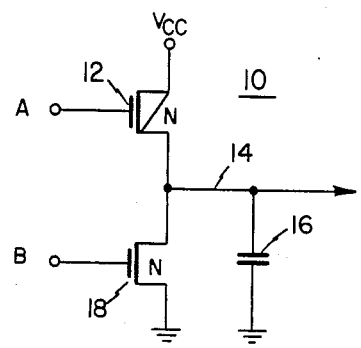
FIG. 1 is a schematic illustration of a driver circuit having an N-channel depletion pull-up transistor and an N-channel enhancement pull-down transistor.

Referring now to FIG. 1 there is shown a driver circuit 10 which can be widely utilized in a read only memory. The circuit 10 includes a pull-up transistor 12 which is an N-channel depletion device. The drain terminal of transistor 12 is connected to a power terminal labeled $V_{cc}$. The source terminal of transistor 12 is connected to a node 14. The node 14 has a capacitive load indicated by a capacitor 16 which is connected between nodes 14 and ground. The gate terminal of transistor 12 is connected to receive a signal labeled A. Circuit 10 further includes a pull-down transistor 18 which has its drain terminal connected to node 14 and its source terminal connected to ground. The gate terminal of transistor 18 is connected to receive an input signal B.

In operation the signals A and B have inverse states such that the transistors 12 and 18 are not driven to conductive states at the same time. The signal generated at the node 14 is typically utilized to drive a circuit, such as a row decoder, in a read only memory. Such a circuit generally has a substantial capacitive load as indicated by the capacitor 16. The transistor 12 is typically fabricated to have a pinch-off voltage ($V_p$) of $-1.0$ volts. Transistor 18 is an enhancement device.

In a first state circuit 10 drives node 14 to a high voltage level of approximately $V_{cc}$. This can be done due to the use of the depletion transistor 12. If an enhancement transistor were used in place of depletion transistor 12, the node 14 could be driven only to within one voltage threshold of the power supply $V_{cc}$ without boosting the voltage at the gate terminal of transistor 12. In a second state the node 14 is pulled to ground potential.

In a large memory the circuit 10 is replicated a great many times such that the power consumption of the overall integrated circuit memory is closely related to the power consumption of each of the driver circuits. The speed at which node 14 can be driven from a low to a high voltage state is of primary importance. For rapidly driving node 14, the transistor 12 is generally fabricated to be a relatively large device. Transistor 18 is made large enough to insure a good low level at node 14 when the gate of transistor 12 is low because transistor 12 is still conductive due to its negative threshold.

In the second state signal A is at a low voltage and signal B is at a high voltage. This pulls node 14 to ground. Since transistor 12 is a depletion device, it will be somewhat conductive with a ground potential applied to the gate terminal. Under this condition, transistor 18 is driven conductive. Therefore, there will be a static current flow through transistors 12 and 18. This static current causes power consumption by circuit 10 and the power consumption is a function of the amplitude of this current.

It is further well known that the current through an MOS transistor is essentially proportional to the width of the transistor. Therefore, the static current flow through transistor 12 is essentially proportional to its width.

In the first state, signal A is at a high level and signal B is at a low level. The low level of signal B turns off transistor 18, thus permitting transistor 12 to pull node 14 high. In the process of driving node 14 to a high voltage state, current will flow through transistor 12 to charge capacitor 16. The greater the current which is passed through transistor 12, the greater the rate at which capacitor 16 can be charged. As noted above, the size of transistor 12 essentially determines the amplitude of current which passes through the transistor. Therefore, the circuit 10 can be made faster by fabricating the transistor 12 to have a large channel area, width, but this increase power consumption as described above. The power consumption of circuit 10 can be reduced by fabricating the channel of transistor 12 to the relatively small, narrow, but this reduces the rate at which the node 14 can be driven. Thus, there is a trade off between speed and power consumption.

In the conventional manufacture of read only memories, a basic circuit is designed to have the fastest speed requirement for any customer. This means that the transistors, such as pull-up transistor 12, must be fabricated to be relatively large devices. This, however, means that the read only memory will have a substantial static power consumption.

In the present invention, the transistor 12 is initially fabricated in a basic circuit to have a given width for high speed operation. This width is then reduced in accordance with the customer speed/power requirements to produce a memory circuit which is optimized for a particular application.

Figure 2:
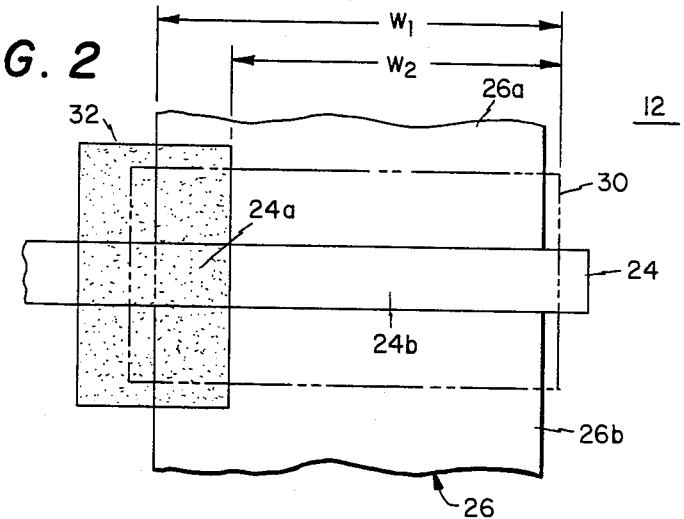
FIG. 2 is a plan view of a depletion transistor as it is fabricated in an integrated circuit showing the reduction in the effective width of the channel of the transistor by means of applying a second implant at an end of the channel.

The method for manufacturing the transistor 12 and controlling the size of its channel is illustrated in FIG. 2. The channel of the transistor 12 is designated by the numberal 24. The channel is located in an active area 26 where the source is designated 26a and the drain is 26b. In integrated circuit technology the length of the channel of an MOS transistor is typically made as small as possible. The width is then selected to meet the current requirement for the transistor. For the transistor 12, the channel is fabricated to have an initial width which is indicated as $W_1$.

The transistor 12 in a preferred embodiment receives a depletion implant 30 over an area indicated by a dashed line. The depletion implant 30 fully encloses the channel 24 of the transistor. The implant 30 is applied only to the channel region within the active area 26 due to the fabrication of oxide, not shown, above the source 26a and drain 26b. The depletion implant 30 is larger than the channel 24 within the transistor to ensure that the channel is fully covered. In a selected embodiment of the present invention, the depletion implant is applied to produce a pinch-off voltage ($V_p$) of approximately $-1.0$ volts. This makes transistor 12 a lightly depleted device which is utilized to drive a node, such as 14, to a full $V_{CC}$.

In an optional embodiment the transistor 12 does not receive the implant 30 but is fabricated to be a natural device.

Further in reference to FIG. 2, the scaling of the power consumption for the transistor 12 is carried out as follows. An enhancement implant 32 shown by the area enclosed by a solid line is applied to the transistor 12. The enhancement implant 32 is applied by means of a mask to cover a selected portion 24a of channel 24. The area of the enhancement implant 32 is larger than the channel 24 to compensate for any errors of alignment in the manufacture of the integrated circuit. The extent of overlap of the enhancement implant over the channel determines the power scaling factor for the transistor 12. In the illustrated embodiment, approximately 20% of the channel region receives the enhancement implant. This serves to reduce the effective width of the channel 24 to that shown as $W_2$. Approximately a 6.0 volt enhancement implant 32 is applied to the transistor 12. This results in a net implant of $+5.0$ volts in section 24a of channel 24 and leaves a $-1.0$ volt implant in the remaining section 24b.

The power supply $V_{cc}$ is typically 5.0 volts which is also the limit for the input signals A and B. Under these conditions the section 24a of channel 24 cannot be driven to a conductive state. Therefore the effective conductive width of channel 24 is that of section 24b. Since the current flow through the transistor 12 is essentially proportional to the width of the channel 24, the transistor 12 has had its current flow reduced by approximately 20%. This also corresponds to the reduction in power consumption by the transistor 12.

The implant 32 need not fully block the sourcedrain current across the channel section it implants, but can be a selected level of implant to reduce the current flow across the channel section it implants.

In the further fabrication of the transistor 12 a polysilicon line, not shown, is fabricated directly above the channel 24 to serve as a gate for the transistor 12.

Figure 3:
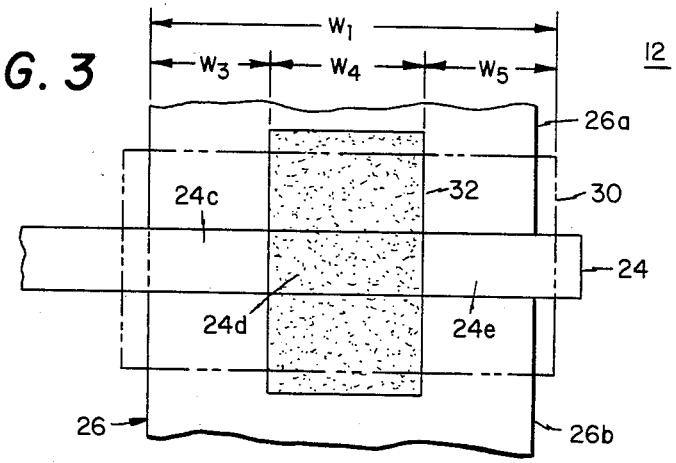
FIG. 3 is a plan view of a depletion transistor as it is fabricated in an integrated circuit showing the reduction in the effective width of the channel of the transistor by means of applying a second implant at a central region of the channel.

Although the implant 32 in FIG. 2 is shown covering one end of the channel 24 it may also be placed in a center section of channel 24 leaving conductive portions on either side of the enhancement implant. This is shown in FIG. 3. The implant 32 covers section 24d of the channel and does not affect sections 24c and 24e. The sections 24c, 24d and 24e have respective widths $W_3$, $W_4$ and $W_5$. The implant configuration shown in FIG. 3 produces effectively the same result as that described in reference to FIG. 2.

Figure 4:
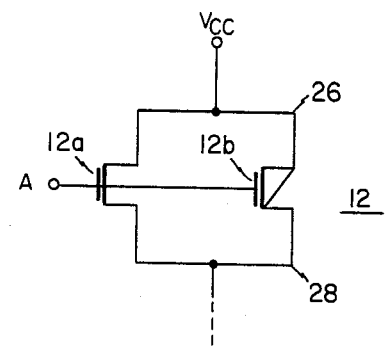
FIG. 4 is a schematic illustration of the circuit equivalent to the MOS transistor shown in FIG. 2.

An equivalent circuit to the transistor 12 shown in FIG. 2 is illustrated in FIG. 4. With both depletion and enhancement sections for the channel 24, the transistor 12 can be represented as two separate transistors having a common drain and common source. A transistor 12a has the source 26a and drain 26b with the channel region corresponding to section 24a. A transistor 12b has the source 26a and drain 26b with the channel region corresponding to section 24b. The transistor 12a is an enhancement device while the transistor 12b is a depletion device. As described in reference to FIG. 2 the transistor 12a has a $V_T$ of $+5.0$ volts and the transistor 12b has a $V_p$ of $-1.0$ volts. The current conductivity of transistor 12*b* is less than that of transistor 12 prior to the application of the enhancement implant 32. With a 5.0 volt supply the transistor 12*a* will not be rendered conductive. However, as noted above, the section 24*a* can be implanted so that the transistor 12*a* is partially conductive.

The size of the enhancement area 32 shown in FIG. 2 can be made to cover any portion of the channel 24 desired. The greater the coverage the less will be the resulting current flow through the transistor 12 and the corresponding reduced power consumption of the transistor 12. In the manufacture of ROM circuits the programming of the customer code is typically done by means of ion implantation in accordance with the pattern provided by the customer. At some stage in the manufacturing process ion implantation is carried out to program the memory array of the circuit with the customer code. The method of the present invention can be easily incorporated into this programming step such that the second implantation of the channel region, enhancement implant 32, can be included in the operation of programming the customer code into the memory array of the ROM circuit. Thus, the method of the present invention can be easily incorporated into current ROM manufacturing techniques without the need for any additional manufacturing operations. The customer can further specify the speed and power consumption of his part at the same time he is specifying the bit pattern to be programmed into the memory.

In summary, a selected embodiment of the present invention comprises a method and apparatus for scaling the speed and power consumption of an MOS transistor by controlling the effective width of the conductive channel of selected transistors by means of first and second ion implantation operations. The preferred application is for depletion, pull-up transistors in a read only memory circuit.

Although two embodiments of the present invention has been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A method of fabricating an MOS read only memory to a customer's specifications, comprising the steps of:
    applying a first type implant to the channels of certain trasistors of the read only memory which have been selected in accordance with the customer's specification, and
    applying a second type implant to a selected portion of said channels in accordance with the customer's specification to reduce the effective size thereof, thereby reducing the source-drain current and corresponding power consumption of said transistors.

2. The method recited in claim 1 wherein said first type implant is depletion and said second type is enhancement and said enhancement type implant is substantially greater than said depletion type implant wherein said selected portion of said channel receives a net enhancement implant.

3. A method of fabricating an MOS read only memory to a customer's specifications, comprising the steps of:
    applying a depletion implant to the channels of selected ones on said MOS transistors which have been selected in accordance with the customer's specification to make depletion transistors of said selected MOS transistors, and
    applying an enhancement implant to a selected portion of each of the channels of said selected transistors in accordance with the customer's specification thereby reducing the effective width of the depletion portion of the channels of said selected transistors wherein the current through said selected transistors and the power consumption of said integrated circuit are reduced.

* * * * *